United States Patent [19]

Cortner

[11] 4,382,257

[45] May 3, 1983

[54] N INDICATOR-SWITCHES CONNECTED FOR ONE OF N SELECTION BY N WIRES

[75] Inventor: Joseph M. Cortner, Cottage Grove, Minn.

[73] Assignee: Sperry Corporation, New York, N.Y.

[21] Appl. No.: 286,735

[22] Filed: Jul. 27, 1981

[51] Int. Cl.[3] .......................... H04Q 1/00; G08B 5/00; H03K 3/284

[52] U.S. Cl. ................................ 340/825.87; 340/332; 307/272 R

[58] Field of Search ........... 340/825.5, 825.87, 825.36, 340/825.17, 332; 361/193, 194; 307/115, 140, 272 R

[56] References Cited

U.S. PATENT DOCUMENTS 3,461,444 8/1969 Eisele .................................. 340/332

3,581,108 5/1971 Eisenmenger .................... 340/825.5

3,590,281 6/1971 Russell ........................... 340/825.36

3,866,211 2/1975 Curtis .................................. 340/332

4,083,013 4/1978 Schultz ................................ 307/272

*Primary Examiner*—Donald J. Yusko

*Attorney, Agent, or Firm*—William C. Fuess; Kenneth T. Grace; Marshall M. Truex

[57] ABSTRACT

Any number N of light emitting diode (LED) push-button indicator-switches are connected by one wire each to a corresponding N interconnected assemblages of four cross-coupled logical elements each. A pushbutton activated signal input through a one connective wire causes a cross-coupled flip-flop storage action within the associated assemblage which will maintain the L.E.D. lit by outputting on the selfsame connective wire after the pushbutton is released. A one-shot circuit merged in each assemblage clears via the interconnect the stored signals of all other assemblages when a new pushbutton signal is activated. One of N selections between N indicator switches is thusly obtained with only one wire connection to each.

7 Claims, 2 Drawing Figures

N INDICATOR-SWITCHES CONNECTED FOR ONE OF N SELECTION BY N WIRES

BACKGROUND OF THE INVENTION

The present invention relates to the electrical circuit control of a multiple number of indicator-switch elements only one of which is desired to be lit at one time, such as light emitting diode (LED) type indicator switches in a selection register of a digital computer.

Prior art structures exist for performing one of N selection through the use of pushbutton indicator-switches. Such a capability—that only one of a assemblage of N elements should be selectable at one time—is useful in the computer arts where one only of a number of sources is desired to be gated to a single destination, such as general display register. Since one of N selection for the purpose of selecting a single source to be gated for display often occurs at a computer indicator display maintenance or control panel, it is desirous to interface one of N display selection occuring at switches, normally indicator-switches, to the remotely situated logic elements by but an economical single wire per each of the N selectable alternatives. The prior art also encompasses this single wire interconnection economy.

The inadequacy of prior art structures is not manifest until N becomes large, meaning that many indicator-switches exist to each selectably enable the display in a single register of a uniquely associated situs or quantity. In support of improved visibility of computer registers and control sites for the purposes of maintenance, it is not unusual to selectably individually gate dozens of different registers to an economical joint display area. This display selection may be effectuated by an encoded register selection, but this requires that the user-operator recall and apply some arbitrary addressing protocol for display selection. It is much to be preferred, even with the attendent proliferation of selection pushbutton switches, that a user-operator should merely touch a labeled switch to select exactly what he/she wants to be displayed in a general register. The prior art logics which support this selection consists of cross-connected AND gates, one associated with each of the N selections. The output of each gate is routed to the input of all others. If one only AND gate output is emplaced in the logical state enabling selection of the associated one of the N selectable registers, as by a switch action then that selfsame output will disable all other AND gates, disabling selection of the associated registers. This straightforward prior art scheme requires N AND gates, or tiered AND logics, having N-1 input signals each. Obviously when N becomes large these requisite N-1 input signals are not supportable by a single AND gate, and a proliferation of logical gates into a tiered structure performing the logical AND function is required. This multiplication of the 1 of N control logics with increasing N is the deficiency of prior art logics, especially for large N.

SUMMARY OF THE INVENTION

The present invention preserves the economical one wire connection between each of a multiple of pushbutton indicator switches as are utilized for one of N selection and the logics which preserve, enabled, and display through the indicator the switch action enable selection. In other words, the logics of the present invention will register a selection occuring at a single one of N pushbutton indicator-switches and respond so that only the selected register or other source is enabled, and so indicated to be enabled, for selection; such as selection to be displayed in a general register. The improved logics for supporting this one of N selection incorporate exactly four interconnected logical elements within each of N stages corresponding to the N indicator-switches corresponding to the N selectable registers or other sources. Even if N is large the one of N selection logics remained fixed at four interconnected logical elements per stage. Furthermore, the interconnection between stages is but a single common line which much facilitates both initial physical implementation and later expansion. The logic structure which accomplishes the one of N selection is a flip-flop merged with a one-shot circuit for each of the N stages. When a pushbutton switch is momentarily actuated the signal input through the associated one connective wire causes a cross-coupled flip-flop storage action which will thereafter maintain the associated indicator lit by outputting the same signal along the selfsame connective wire—even should the switch stimuli subsequently be removed. Furthermore, a one-shot circuit enabled by the switch action clears through a single line interconnecting all stages any and all stored signals. The switch actuated stage(s) only will become set upon the cessation of this one-shot generated clearing signal. Therefore the effect is that a single switch selected one of an N element indicator-switch array will become set, or enabled, while all other selections will be disabled.

DESCRIPTION OF THE PREFERRED EMBODIMENT

Figure 1:
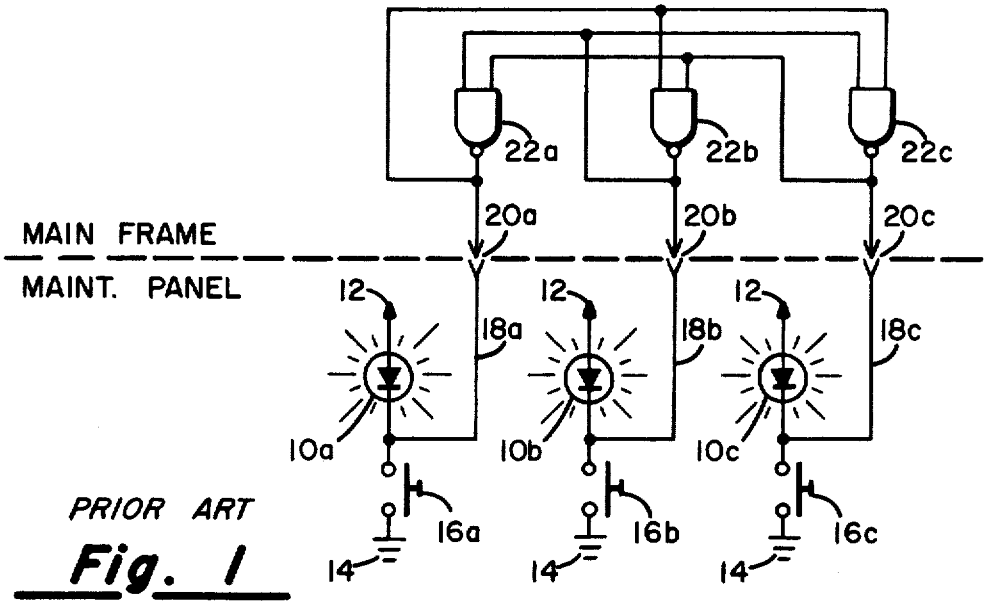
PRIOR ART Fig. 1
FIG. 1 shows a prior art logical structure for performing 1 of N selection on N=3 pushbutton indicator switches.

A prior art logical structure for performing 1 of N selection on N pushbutton indicator switches, N=3, is shown in FIG. 1. Light emitting diode indicators 10a, 10b, 10c, are individually connected between supply voltage 12 and ground 14 through the pushbutton action of a respective associated one of series connected switches 16a, 16b, 16c. Each ones of indicators 10a, 10b, 10c is normally physically integral with the associated one of switches 16a, 16b, 16c as a unitary pushbutton indicator switch assembly, which is mounted in an operator interface and control area called a Maintenance Panel. Indicator 10a and switch 16a are connected from the node of their series interconnection to AND gates 22a, 22b, 22c—located in the Main Frame—through wire net 18a in conjunction with connectors 20b and 20c, respectively interconnect the second and the third (final) indicator switch to AND gates 22a, 22b, 22c. It may be observed that each of wire nets 18a, 18b, and 18c connects a respective single one of switches 16a, 16b, 16c and a respective single output of AND gates 22a, 22c to the inputs of all other AND gates. Therefore, if a ground, or logical low, is momentarily impressed on wire net 18a through the pushbutton actuation of switch 16a both AND gates 22b and 22c will be disabled, outputting a logical high on wire nets 18b and 18c, respectively. The logical high on both wire nets 18b and 18c will satisfy AND gate 22a and cause a logical low to be output. This logical low on wire net 18a will maintain indicator 10a lit even should pushbutton switch 16a be released. Conversely, this continuing logical low in wire net 18a will maintain AND gates 22b and 22c in the disabled state, causing a logical high to be continued in wire nets 18b and 18c, respectively, which causes indicators 10b and 10c, respectively, to remain unlit. Similarly to the manner in which the first switch 16a enabled the 1 of N selection of indicator 10a, the actuation of any one of switches 16a, 16b, 16c will enable the corresponding one of indicators 10a, 10b, 10 *c* while disabling all other indicators.

Any interconnecting structure of logics such as would allow the prior art circuit of FIG. 1 to effectuate a register selection, or gating control, or any like actuation of 1 out of N alternatives is not shown as not germane to the 1 of N selection circuit itself, and is generally dependent upon the specific utilization for which 1 of N selection is being employed. The interconnection points representative of the status of the 1 of N selection logics are simply wire sets 18a, 18b, ad 18c. The prior art circuit of FIG. 1 is elegantly simple for 1 of 3 selection. However, if it is envisioned that the same design should be extended to 1 of N selection for large N then each AND gate 22 would have many inputs and wire nets 18 would be large. The simplistic 1 of N selection circuit of FIG. 1 utilizes an inefficient number of logical AND elements and large amount of interconnection wiring when N is large.

Figure 2:
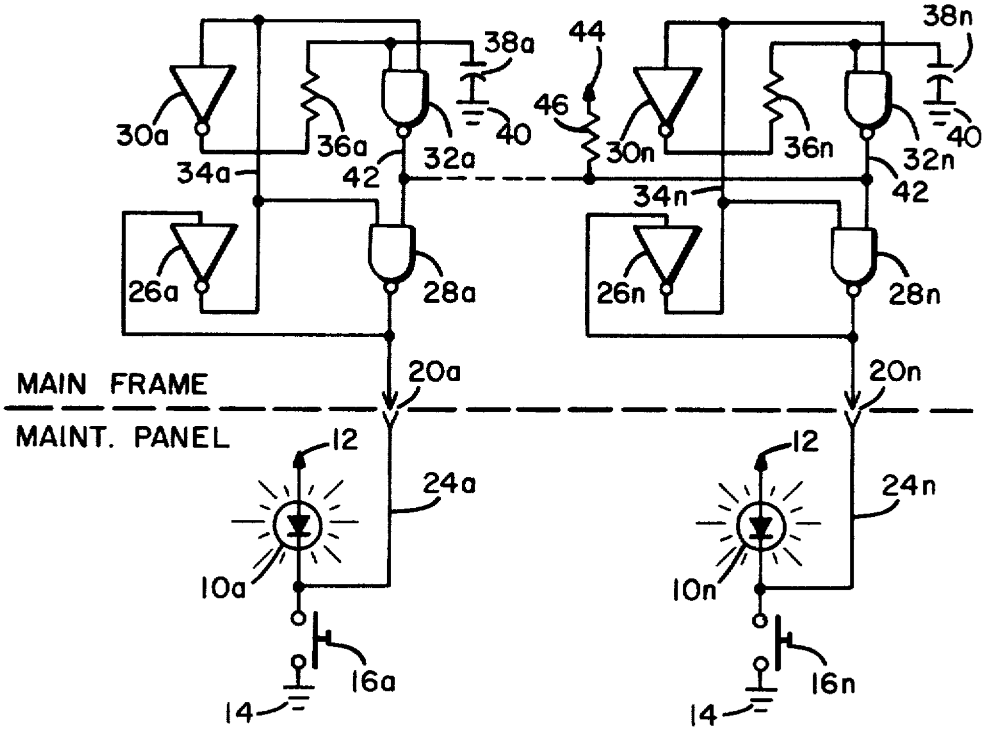
FIG. 2 shows the logical structure of the present invention such as performs 1 of N selection on N pushbutton indicator switches.

The present invention of an improved logical circuit apparatus, connected to N indicator switches by N wires, for performing 1 of N selection is shown in FIG. 2. The 1 of N selection performed produces N parallel signals of which only 1 will be actuated at any one time. The initiation of a pushbutton switch action will establish the associated signal while canceling any previous signal. The present invention continues the prior art one wire interconnection between the 1 of N selection logics and each of the N indicator-switches. The inventive improvement lies in a cross-coupled gate-constructed flip-flop-for storage of the activated signal state—structually (logically) merged in a one-shot circuit—for clearing all previous signals when a new signal is activated through actuation of a pushbutton switch.

Continuing in FIG. 2, the series connection of light emitting diodes indicators 10a thorugh 10n respectively with pushbutton switches 16a through 16n between voltage source 12 and ground 14 is seen to be identical to the prior art circuit of FIG. 1. The series interconnection nodes between each indicator 10a through 10n and its respective switch 16a through 16n are respectively connected to the 1 of N selector logics through wire nets 24a through 24n and connectors 20a through 20n. Specifically, each wire net 24a through 24n respectively connects the associated indicator switch to sole input of first inverters 26a through 26n and to the output of first AND gates 28a through 28n.

Continuing in FIG. 2, the 1 of N selector circuit shown therein as located in the main frame, or area of logics, entails two additional logic elements, two additional wire nets, and two discrete components per pushbutton switched selector stage as well as one universal wire net interconnecting all stages. The outputs of first logic inverters 26a through 26n are respectively routed to the sole inputs of second logic inverters 30a through 30n and to the first inputs of both first AND gates 28a through 28n and second AND gates 32a through 32n by the respective wire nets 34a through 34n. The outputs of second inverters 30a through 30n are respectively connected to the second inputs of second AND gates 32a through 32n through respective resistors 36a through 36n, and from those input connection points to ground 40 through respective capacitors 38a through 38n. The final wire net 42, interconnecting all selector stages, connects the logically OR'ed output of all second AND gates 32a through 32n in common to the second inputs of first AND gates 28a through 28n. This wire net 42 is also connected to voltage source 44 through one or more pull up resistors 46.

The functional operation of the preferred embodiment of the present invention as shown in FIG. 2 is as follows. Due to the pull up effect of light emitting diode indicators 10a through 10n on respective wire nets 24a through 24n, the output of first inverters 26a through 26n will go to a logical low respectively causing the outputs of first AND gates 28a through 28n to maintain logical highs on such respective wire nets 24a through 24n upon power on. These logical highs on wire nets 24a through 24n respectively maintain indicators 10a through 10n in the unlit condition upon power on. When a first one of switches 16a through 16n is initially depressed, a logical low, or ground, is imposed in the associated one of wire nets 24a through 24n. This low is inverted in the associated one of first inverters 26a through 26n and applied through the associated one of wire nets 34a through 34n as a first input to the associated one of first AND gates 28a through 28n. After a period of time shorter than the release of this first one of switches 16a through 16n, the logical high on the associated one of wire nets 34a through 34n as inverted by the associated one of second inverters 30a through 30n will cause a logical low to be second input to the associated one of second AND gates 32a through 32n. The logical high output on net 42 from this associated one of second AND gates 32a through 32n will be second input to all first AND gates 28a through 28n, while being the second logical high input only to the single associated one of first AND gates 28a through 28n which is in the identical stage with the initial switch action. The two logical highs input to this associated one of first AND gates 28a through 28n will cause, by flip-flop action, the associated stage to become latched with a logical low output on the associated one of wire nets 24a through 24n. This logical low maintains the originally associated one of indicators 10a through 10n in the lit condition even when the first actuated switch is released.

When another subsequent one of switches 16a through 16n is depressed the resultant change from a logical low to a logical high in the associated one of nets 34a through 34n will, in conjunction with the associated one of second inverters 30a through 30n plus the associated one of resistors 36a through 36n plus the associated one of capacitors 38a through 38n plus the associated one of second AND gates 32a through 32n, cause a one-shot action resulting in a short duration logical low pulse on wire net 42. This one-shot logical low pulse is simply resultant from the new logical high first input to the associated one of second AND gates 32a through 32n before the second input to the same gate can be brought to a logical low level by the action of the associated one of second inverters 30a through 30n in discharging the associated one of capacitors 38a through 38n through the associated one of resistors 36a through 36n. The resulting logical low pulse on wire net 42 will disable all first AND gates 28*a* through 28*n* long enough to clear the latches of that stage. Since the manual switch action is much longer than the one-shot produced pulse the single switch activated circuit will remain latched by the mechanism previously described. In other words, one only of N indicators has been selected by an associated switch action transmitted through but a single wire.

The choice of component values for resistors 36*a* through 36*n*, capacitors 38*a* through 38*n*, and pull up resistor(s) 46 (if employed) calculable as producing an RC time constant of the desired duration for the logical elements employed. If standard transistor transistor logics (TTL) connected to a +5 v.d.c. voltage source 44 are employed, a value of 120 ohms for resistors 36*a* through 36*n* and a value 0.1 microfarads for capacitators 38*a* through 38*n* will produce, depending on input threshold sensitivities of the logical elements, a low going pulse is approximately 1.2 microseconds on wire net 42. This, or a similar short pulse duration, is sufficient to clear the latches of all N stages while allowing the selected stage to become latched under the much longer persistence of the switch actuation. The value of the pull up resistor 46, if needed, is normally adjusted in consideration of the current drive capabilities of second AND gates 32*a* through 32*n* and the number of N of driven stages in the 1 of N selector circuitry.

As with the prior art circuitry of FIG. 1, the interconnection of the 1 of N selector circuit of the current invention for any further logical purposes is not shown as not integral to the present invention. Each of the N stages is obviously accessible through the wire nets 24*a* through 24*n* and 34*a* through 34*n* for the provision of control signals to other further logics such as gating logics.

What is claimed is:

1. A method for bidirectionally receiving and providing on a plurality of signal lines a plurality of parallel signals only one of which is presented at a time, said method comprising:

receiving for a time as input a signal on any single one of said plurality of signal lines;

latching, in response to the entire duration of said receiving, said received input signal into a single one of a plurality of storage elements which is uniquely associated with said single one of said plurality of single lines;

initiating in response to said receiving a pulse signal which is shorter in duration than the time of said receiving;

distributing said initiated pulse signal for the clearing of all said plurality of storage elements as associated with all said plurality of signal lines; and providing as output on said plurality of signal lines the set or cleared state of said plurality of storage elements;

whereby because of said latching, longer in duration than said distributing for clearing, said providing as output will cause, after said receiving for a time, said latched received input signal to be output on the selfsame said signal one of said plurality of signal lines, whereas a cleared state will be output on all others of said plurality of signal lines.

2. The method of claim 1 whereby the duration of said initiating is made shorter than the duration of said receiving because said receiving step further comprises:

receiving as input a mechanical switch generated signal longer than 1.2 microseconds; and because said initiation step further comprises:

initiating via a resistance-capacitance time delayed one shot action pulse signal shorter than 1.2 microseconds.

3. The method of claim 1 further comprising as a preliminary step executed only as initialization;

initializing upon power on into a cleared state said plurality of storage elements associated with said plurality of signal lines.

4. An electrical circuit apparatus for bidirectionally receiving and providing on a plurality of signal lines a plurality of parallel signals only one of which is presented at a time, which apparatus comprises:

a plurality of cross-coupled flip-flop storage action latching means associated with said plurality of signal lines for gating set by an associated received on of said plurality of parallel signals for the duration of said received signal as input on one of said plurality of signal lines, storing said associated received one of said plurality of parallel signals as input on one of said plurality of signal lines, and outputting on said associated received one of said plurality of signal lines the stored signal;

a plurality of one-shot circuit means associated with said plurality of signal lines and merged with said plurality of latching means for providing, in response to an associated received one of said plurality of parallel signals received as input on one of said plurality of signal lines, a pulsed control signal shorter in duration than the time of said received one of said plurality of parallel signals; and interconnection wire means for distributing each said pulsed control signals on a clear signal input to all said plurality of latching means;

whereby the clearing of all said latching means shorter in duration than the gating set of the one said latching means associated with said received one of said plurality of input signals will result in storing and outputting on only the one of said plurality of latching means which was associated with the one of said plurality of parallel signals.

5. The apparatus according to claim 4 wherein each said one-shot circuit means further comprises:

a resistor limiting the charge buildup on a capacitor so that logical AND gate means triggering upon an inverted signal level at the junction of said resistance and said capacitance, and upon said signal level, will exhibit such delay as will cause a one-shot, pulse output from said logical AND gate means.

6. A circuit appartus for connecting by N wires to a register of N indicator-switches so that the, and only the, indicator associated with the last activated switch will light, said apparatus comprising:

a plurality of N replicated assemblies individually associated with each of said N indicator-switches, bidirectionally responsive through said N wires thereto, and each comprising the following elements:

first logic inverter means for receiving as a first signal the state of said wire connected to sid indicator-switch and outputting as a second signal the inversion of said received signal, second logic inverter means for receiving said second signal and for outputting as a third signal the inversion of said second signal, delay means for receiving said third signal and for outputting as a fourth signal a non-inverted but time delayed variation of said third signal, first NAND gate means for receiving said third signal and said fourth signal and responsively thereto outputting a fifth signal which is the inverted logical ANDing of said third signal and said fourth signal, second NAND gate means for receiving said second signal and said fifth signal and responsively thereto outputting as a sixth signal logically wired ORed with said first signal the inverted logical ANDing of said second signal and said fifth signal; and wire interconnection means whereby all said plurality of N replicated assemblies are interconnectedly logically ORed in said fifth signal.

7. The apparatus of claim 6 which further comprises:

one or more pull up resistor means for establishing said interconnected logically ORed fifth signal at a logical level wherein it may reliably unambiguously input to all said second NAND gate means within said plurality of N replicated assemblies.

* * * * *